(12) United States Patent
Turner

(10) Patent No.: US 10,564,004 B2
(45) Date of Patent: Feb. 18, 2020

(54) LONG RANGE MAGNETIC PROXIMITY SENSOR

(71) Applicant: Bourns, Inc., Riverside, CA (US)

(72) Inventor: Kenneth R. Turner, Waterford, MI (US)

(73) Assignee: Bourns, Inc., Riverside, CA (US)

( * ) Notice: Subject to any disclaimer, the term of this patent is extended or adjusted under 35 U.S.C. 154(b) by 0 days.

(21) Appl. No.: 15/778,099

(22) PCT Filed: Sep. 26, 2016

(86) PCT No.: PCT/US2016/053738
§ 371 (c)(1),
(2) Date: May 22, 2018

(87) PCT Pub. No.: WO2017/099866
PCT Pub. Date: Jun. 15, 2017

(65) Prior Publication Data
US 2018/0335317 A1    Nov. 22, 2018

Related U.S. Application Data

(60) Provisional application No. 62/265,680, filed on Dec. 10, 2015.

(51) Int. Cl.
*G01B 7/14*       (2006.01)
*G01B 7/30*       (2006.01)
(Continued)

(52) U.S. Cl.
CPC .............. *G01D 5/142* (2013.01); *G01D 5/12* (2013.01); *G01D 5/145* (2013.01); *G01D 11/245* (2013.01);
(Continued)

(58) Field of Classification Search
CPC ...... G01D 5/145; G01D 5/142; G01D 11/245; G01D 5/12; G01R 33/07; G01R 33/077; G01R 33/072; G01R 33/09
(Continued)

(56) References Cited

U.S. PATENT DOCUMENTS 4,665,362 A * 5/1987 Abel ................... G01D 5/147
                                                324/207.2
6,703,830 B2   3/2004 Kaste
(Continued)

FOREIGN PATENT DOCUMENTS

GB    2125970 A       3/1984
WO    2009135734 A1   11/2009

OTHER PUBLICATIONS

International Search Report and Written Opinion for Application No. PCT/US2016/053738 dated Jan. 10, 2017 (9 pages).
(Continued)

*Primary Examiner* — Raul J Rios Russo
(74) *Attorney, Agent, or Firm* — Michael Best & Friedrich LLP

(57) ABSTRACT

A magnetic proximity sensor includes first and second spaced wings. Each wing has a protrusion extending outwardly from an edge near or at a corner thereof. The protrusions face each other to provide a narrow gap area. A magnetic assembly secured to each of the wings extends across the gap and is spaced from the protrusions. A magnetic sensor element is disposed at the narrow gap area. The magnetic assembly projects magnetic flux toward the first wing. Magnetic flux passes via the first wing and the protrusion thereof and crosses the narrow gap area to the protrusion of the second wing. The second wing provides a
(Continued)

return path for magnetic flux to the magnetic assembly. The magnetic proximity sensor senses decreased magnetic flux when a target approaches.

20 Claims, 19 Drawing Sheets

(51) Int. Cl.
    *G01R 33/06*     (2006.01)
    *H01L 43/06*     (2006.01)
    *G01D 5/14*     (2006.01)
    *G01R 33/00*     (2006.01)
    *G01R 33/07*     (2006.01)
    *G01D 11/24*     (2006.01)
    *G01D 5/12*     (2006.01)
    *G01R 33/09*     (2006.01)

(52) U.S. Cl.
    CPC .......... *G01R 33/0011* (2013.01); *G01R 33/07* (2013.01); *G01R 33/072* (2013.01); *G01R 33/077* (2013.01); *G01R 33/09* (2013.01)

(58) Field of Classification Search
    USPC .......... 324/51, 55, 178, 200, 207.11, 207.13, 324/207.2, 251, 341
    See application file for complete search history.

(56) References Cited

U.S. PATENT DOCUMENTS

| | | | |
|---|---|---|---|
| 7,489,217 B2 | 2/2009 | Rohrig, III et al. | |
| 8,847,580 B1 | 9/2014 | Osterweil | |
| 2003/0155909 A1* | 8/2003 | Steinruecken | G01D 5/147 324/207.2 |
| 2004/0113403 A1* | 6/2004 | Mills | B60N 2/0224 280/735 |
| 2004/0189287 A1 | 9/2004 | Suzuki et al. | |
| 2006/0092565 A1* | 5/2006 | Ho | G11B 5/1278 360/125.3 |
| 2006/0092569 A1* | 5/2006 | Che | G11B 5/11 360/128 |
| 2006/0202679 A1 | 9/2006 | Kogure et al. | |
| 2007/0029996 A1 | 2/2007 | Spellman | |
| 2007/0230045 A1* | 10/2007 | Hsiao | G11B 5/1278 360/125.02 |
| 2008/0230328 A1 | 9/2008 | Lacroix et al. | |
| 2010/0072830 A1 | 3/2010 | Ausderau | |
| 2010/0231058 A1 | 9/2010 | Hoppe | |
| 2012/0293165 A1 | 11/2012 | Zwijze et al. | |
| 2013/0141083 A1* | 6/2013 | Lee | G01D 5/145 324/207.15 |
| 2014/0225595 A1 | 8/2014 | Sato | |

OTHER PUBLICATIONS

Lenz et al., "Magnetic Sensors and Their Applications," IEEE Sensors Journal, 2006, 6(3):631-649.

European Patent Office Extended Search Report for Application No. 16873511.6 dated Jul. 15, 2019 (9 pages).

* cited by examiner

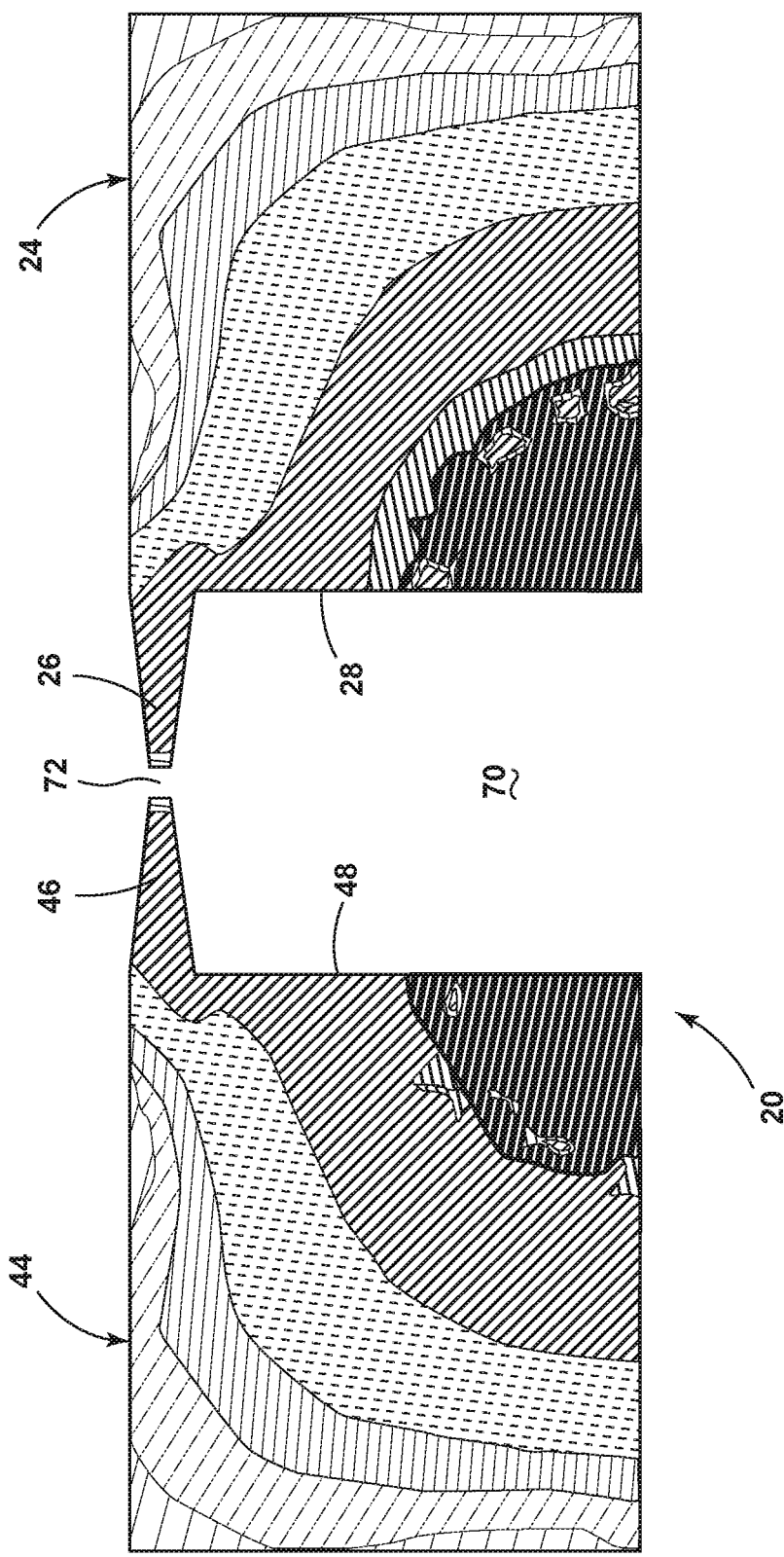

LONG RANGE MAGNETIC PROXIMITY SENSOR

RELATED APPLICATIONS

The present application claims priority to U.S. Provisional Patent Application No. 62/265,680, filed Dec. 10, 2015, the entire content of which is herein incorporated by reference.

BACKGROUND

Embodiments of the invention relate to magnetic proximity sensors.

SUMMARY

In one embodiment, the invention provides a magnetic proximity sensor comprising a first wing including a protrusion protruding outwardly from an edge thereof, a second wing including a protrusion protruding outwardly from an edge thereof, the edge of the second wing being spaced from and facing the edge of the first wing to form a gap therebetween, and the protrusions facing each other to provide a narrow gap area between the protrusions. A magnetic assembly is secured to the first wing adjacent the edge of the first wing and secured to the second wing adjacent the edge of the second wing, and spaced from the narrow gap area. The magnetic assembly extends across the gap and is aligned to project a magnetic flux toward the first wing. A magnetic sensor element is disposed at the narrow gap area between the first wing and the second wing. The magnetic assembly projects a magnetic flux toward the first wing, and the magnetic flux passes via the first wing and the protrusion of the first wing across the narrow gap area that includes the magnetic sensor element to the protrusion of the second wing and via the second wing to return to the magnetic assembly.

In another embodiment, the magnetic assembly includes a permanent magnet having a first end adjacent the first wing that projects the magnetic flux and a second end adjacent the second wing that receives the magnetic flux. In another embodiment, the magnetic proximity sensor includes a magnetic flux generator.

In one embodiment, the magnetic sensor element includes a Hall effect sensor.

In another embodiment, the first wing and the second wing are aligned in a common plane and the second wing is a mirror image of the first wing.

In one embodiment, the first wing and the second wing are disposed essentially within a same plane and the first wing and the second wing each comprise a high permeability material.

In one embodiment, an approaching target provides an alternative path for at least a portion of the magnetic flux sensed by the magnetic sensor element, and reduced magnetic flux sensed by the magnetic sensor element indicates closeness of an approaching target.

In another embodiment, an approaching target has a substantially rectangular flat sheet of a high permeability material that faces a planar face of the first wing and a planar face of the second wing, wherein a high permeability material attracts magnetic flux.

In one embodiment, the edge of the first wing is substantially parallel to the edge of the second wing except for the protrusions that face each other.

In another embodiment, each of the first wing and the second wing have a substantially rectangular shape and the protrusions are oriented outwardly each include an outwardly oriented substantially linear edge portion. Each of the wings and the respective protrusions are substantially planar on opposing faces thereof.

In one embodiment, the magnetic proximity sensor has a height that is between about 25% and about 50% of the length of the magnetic proximity sensor.

In another embodiment, the protrusions of each of the wings are generally triangular shaped protrusions and are planar. In another embodiment, the wings each include a thin high permeability metal sheet and the protrusion is monolithic therewith.

In one embodiment, the narrow gap area between the protrusions is near a corner of the first wing and near a corner of the second wing.

In another embodiment, the first wing and the second wing are aligned in a common plane and the second wing is non-symmetric with respect to the first wing.

In another embodiment, the invention provides a magnetic proximity sensor comprising a first wing having a substantially planar face and a protrusion protruding from an edge, a second wing having a substantially planar face and a protrusion protruding from an edge thereof, the edge of the second wing being spaced from and facing the edge of the first wing to form a gap therebetween, and the protrusions facing each other to provide a narrow gap area between the first wing and the second wing. A magnetic assembly is secured to the first wing near or at the edge of the first wing and is secured to the second wing near or at the edge of the second wing. The magnetic assembly is spaced from the narrow gap area and extends substantially across the gap. The magnetic assembly is aligned to project a magnetic flux toward the first wing. A magnetic sensor element is disposed near the narrow gap area between the first wing and the second wing. The magnetic assembly projects the magnetic flux toward the first wing, and at least a portion of the magnetic flux passes via the first wing and the protrusion of the first wing across the narrow gap area to the protrusion of the second wing and via the second wing to the magnetic assembly. The magnetic sensor element senses the magnetic flux to determine when an approaching target approaches the magnetic proximity sensor.

In another embodiment, the magnetic proximity sensor provides a signal to a seat controller of a vehicle seat control system.

Other aspects of the invention will become apparent by consideration of the detailed description and accompanying drawings.

BRIEF DESCRIPTION OF THE DRAWINGS

FIG. 9B is a front view of the magnetic proximity sensor near the target in FIG. 8 and illustrating magnetic flux of the wings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
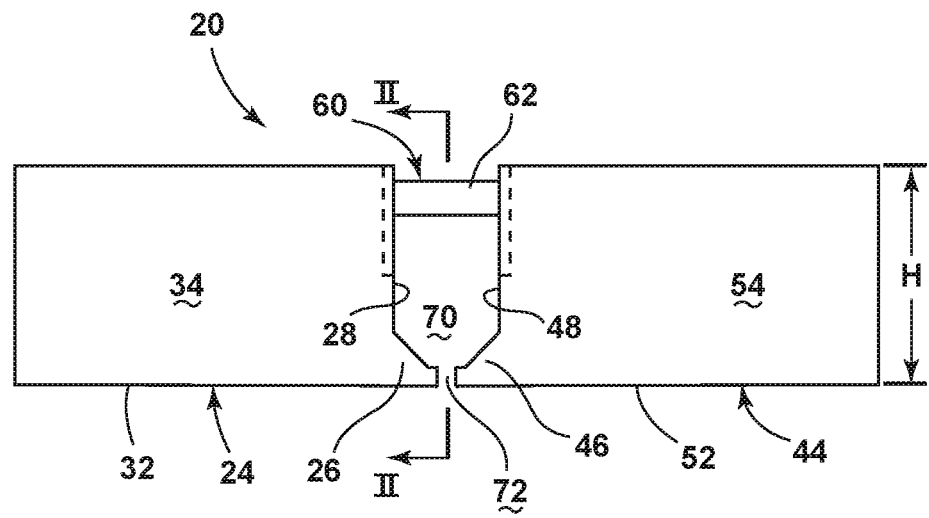
FIG. 1 is a front view of a magnetic proximity sensor of FIG. 1.

FIG. 1 illustrates one embodiment of a long range magnetic proximity sensor 20 that includes a wing 24 having a substantially rectangular shape and a generally triangular shaped protrusion 26 extending inwardly from and forming an inwardly extended lower corner thereof. The wing 24 includes an inner edge 28 and a lower edge 32. The lower edge 32 is an essentially straight edge of the wing 24 that also includes a lower edge of the generally triangular shaped protrusion 26. The wing 24 includes a substantially planar face 34.

The magnetic proximity sensor 20 shown in FIG. 1 also includes a wing 44 having a substantially rectangular shape and a generally triangular shaped protrusion 46 extending inwardly from and forming an inwardly extended lower corner thereof. The wing 44 includes an inner edge 48 and a lower edge 52. The wing 44 includes a substantially planar face 54. In one embodiment, the wing 44 is essentially a mirror image of the wing 24. The first wing 24 and the second wing 44 are aligned essentially within a same or common plane and the first wing and the second wing each are formed by a high permeability material. Further, the inner edge 28 of the first wing 24 is substantially parallel to the inner edge 48 of the second wing 44 except for the respective facing protrusions 26, 46 that each include an outwardly oriented substantially linear edge portion. However, in other embodiments, the wings are not entirely in the same plane.

Figure 2:
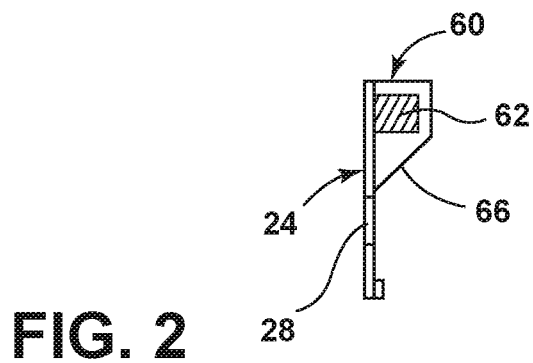
FIG. 2 is a cross-sectional view taken at II-II in FIG. 1.

The magnetic proximity sensor 20 shown in FIG. 1 also includes a magnetic assembly 60. The magnetic assembly 60 includes a permanent magnet 62 and a support 66 as shown in the cross sectional view of FIG. 2. A support 66 is provided near the edge 28 of the wing 24 and near the edge 48 of the wing 44. Via the supports 66, the permanent magnet 62 has a first end adjacent or near the inner edge 28 of the wing 24 and a second end adjacent or near the inner edge 48 of the second wing 44. Besides securing the wings 24, 44 to each other to form the magnetic proximity sensor 20, the magnetic assembly 60 extends across or bridges a gap 70 located between the wings 24, 44. The magnetic assembly 60 is spaced from the protrusions 26, 46.

Figure 3:
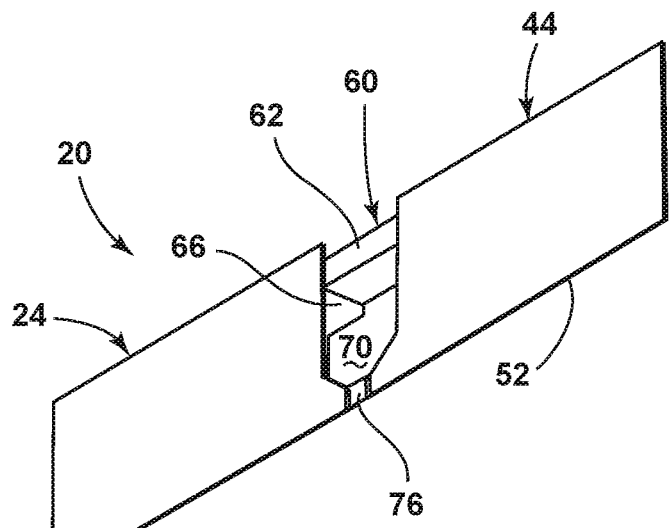
FIG. 3 is a perspective view of the magnetic proximity sensor of FIG. 1

In the embodiment of FIG. 1, the gap 70 is formed between the essentially parallel and facing inner edges 28, 48 of the respective wings 24, 44. The respective facing protrusions 26, 46 of the respective wings 24, 44 protrude outwardly toward each other to provide a narrow gap area 72 of the gap 70 as shown in FIG. 1. As shown in FIG. 3, a Hall effect sensor 76 or another type of magnetic sensor element is provided at the narrow gap area 72. In some embodiments, the Hall effect sensor 76 is secured to both of the protrusions 26, 46 of the respective wings 24, 44 to provide structural support for the body of the magnetic proximity sensor 20. The magnetic assembly 60 is spaced from the narrow gap area 72 and the Hall effect sensor 76 as shown in the embodiment of FIG. 1 and FIG. 3.

Figure 4:
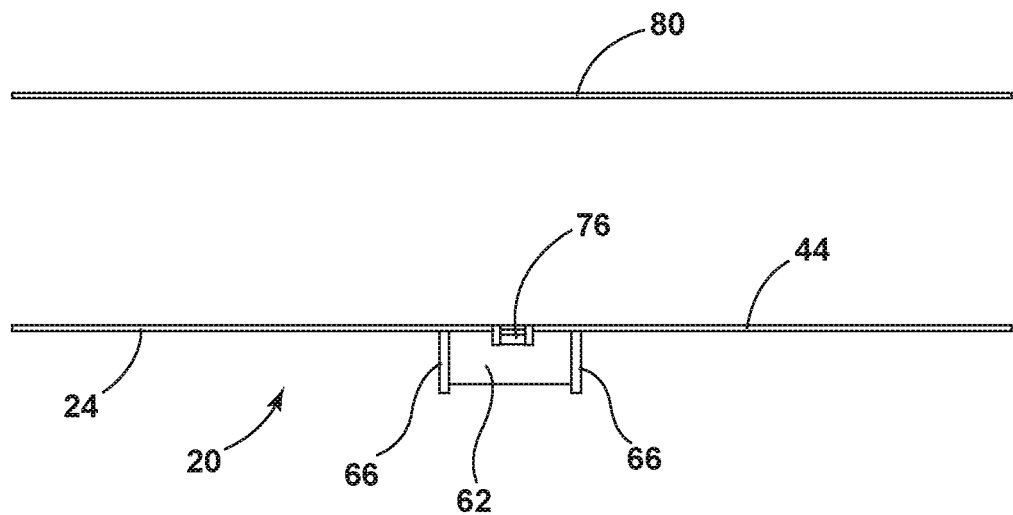
FIG. 4 is a top view of the magnetic proximity sensor and a target.
Figure 5:
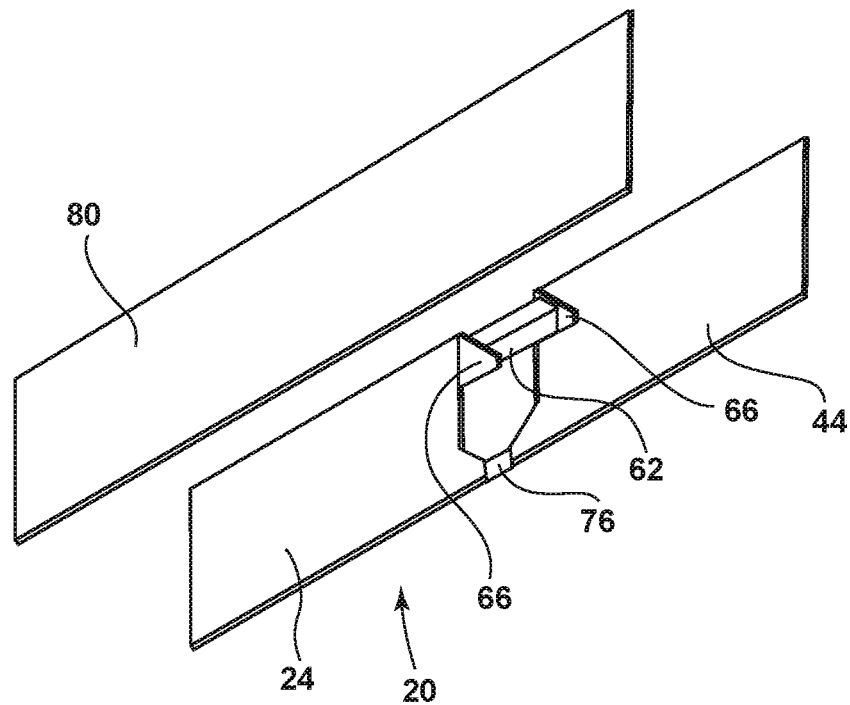
FIG. 5 is a perspective view of the magnetic proximity sensor and a target.

FIG. 4 and FIG. 5 show a target 80 approaching the magnetic proximity sensor 20 of FIG. 1. In one embodiment, the target 80 is a thin high permeability metal sheet or other generally flat thin member having a high permeability to attract magnetic flux.

Operation

Figure 6:
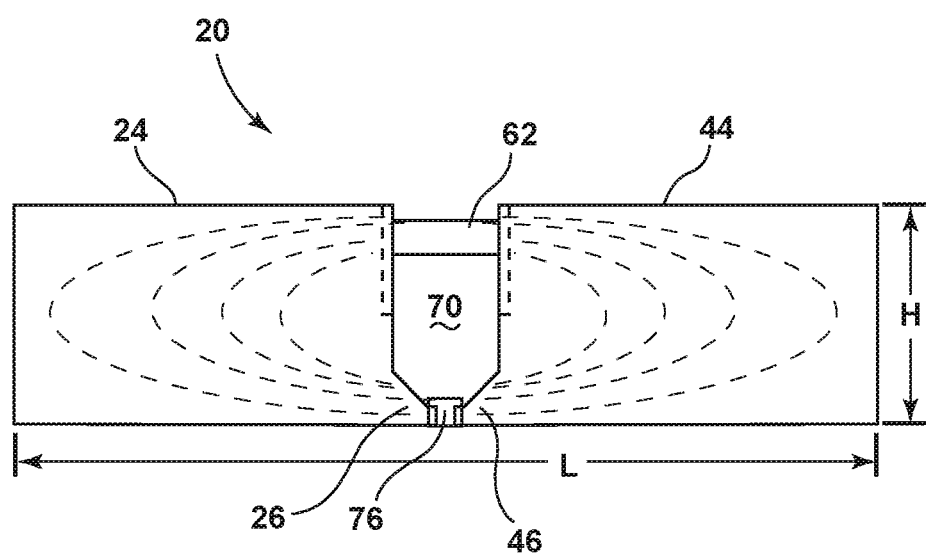
FIG. 6 is a front view of the magnetic proximity sensor with magnetic flux lines illustrated.

FIG. 6 includes magnetic flux lines illustrating the operation of an embodiment of the magnetic proximity sensor 20. In the FIG. 6 embodiment, the N pole of the permanent magnet 62 is oriented to the left. Thus, magnetic flux is output from the N pole of the permanent magnet 62 toward and/or into an upper and inner portion of the wing 24. A return magnetic flux is received at an opposing S pole of the permanent magnet 62 disposed near an upper and inner corner of the wing 44. The flux lines in FIG. 6 show a path for magnetic flux via the wing 24 to the protrusion 26 thereof. The flux travels across the narrow gap area 72 that includes the Hall effect sensor 76 to the protrusion 46 of the wing 44 and through or via the wing 44 until returning to the S pole of the permanent magnet 62. As the permanent magnet 62 is fixed relative to the wings 24, 44, the value of the magnetic flux sensed by the Hall effect sensor 76 should not vary significantly during typical conditions.

As a target 80 having a high permeability approaches the magnetic proximity sensor 20 shown in FIGS. 4 and 5, a portion of the magnetic flux output by the permanent magnet 62 near the wing 24 is attracted to the target. A portion of the magnetic flux then passes along the target 80 in a direction substantially parallel to the permanent magnet and returns to the wing 44 near the S pole of the permanent magnet 62. By necessity, as the magnetic flux attracted to the approaching target 80 increases, the magnetic flux measured by the Hall effect sensor 76 decreases. Thus, the approaching target 80 provides an alternative path for at least a portion of the magnetic flux sensed by the Hall effect sensor 76.

Figure 7:
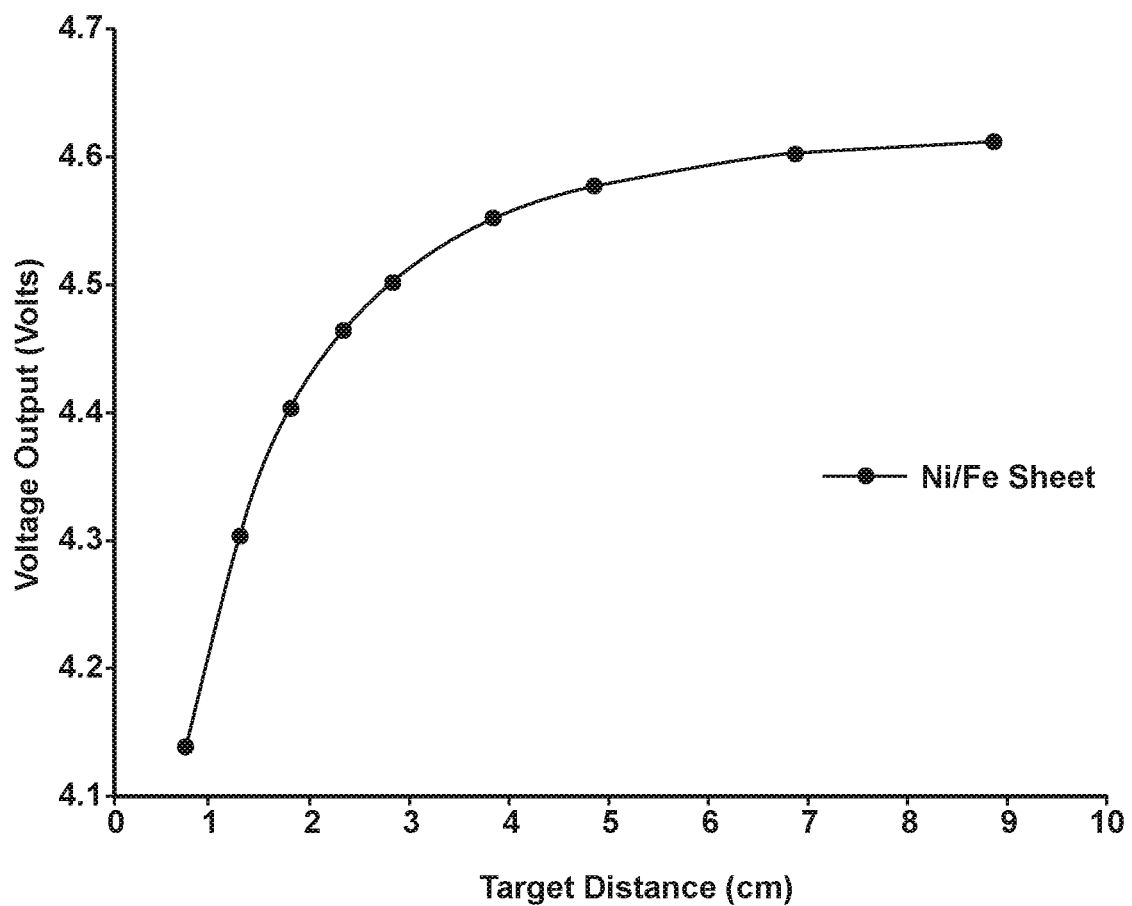
FIG. 7 is a graph displaying voltage output by the magnetic proximity sensor as a target approaches.

As shown in FIG. 7, in one embodiment when the target 80 approaches five centimeters from the magnetic proximity sensor 20, the voltage measured by the Hall effect sensor 76 decreases at an increasing rate. Thus, proximity of the target 80 relative to the magnetic proximity sensor 20 is determined before contact between the target 80 and the magnetic proximity sensor 20 as the Hall effect sensor 76 senses a decrease or reduced magnetic flux that indicates the closeness of the target.

As shown in FIGS. 4 and 5, in one embodiment the target 80 is a substantially rectangular flat sheet, such as a rectangular shaped steel sheet, having dimensions similar to the wings 24, 44 that form the magnetic proximity sensor 20. The parallel alignment shown in FIGS. 4 and 5 ensures that the magnetic flux received by the target 80 is maximized due to the large area of the target 80 that faces a corresponding large area of the nearby faces 34, 54 of the wings 24, 44.

Figure 8:
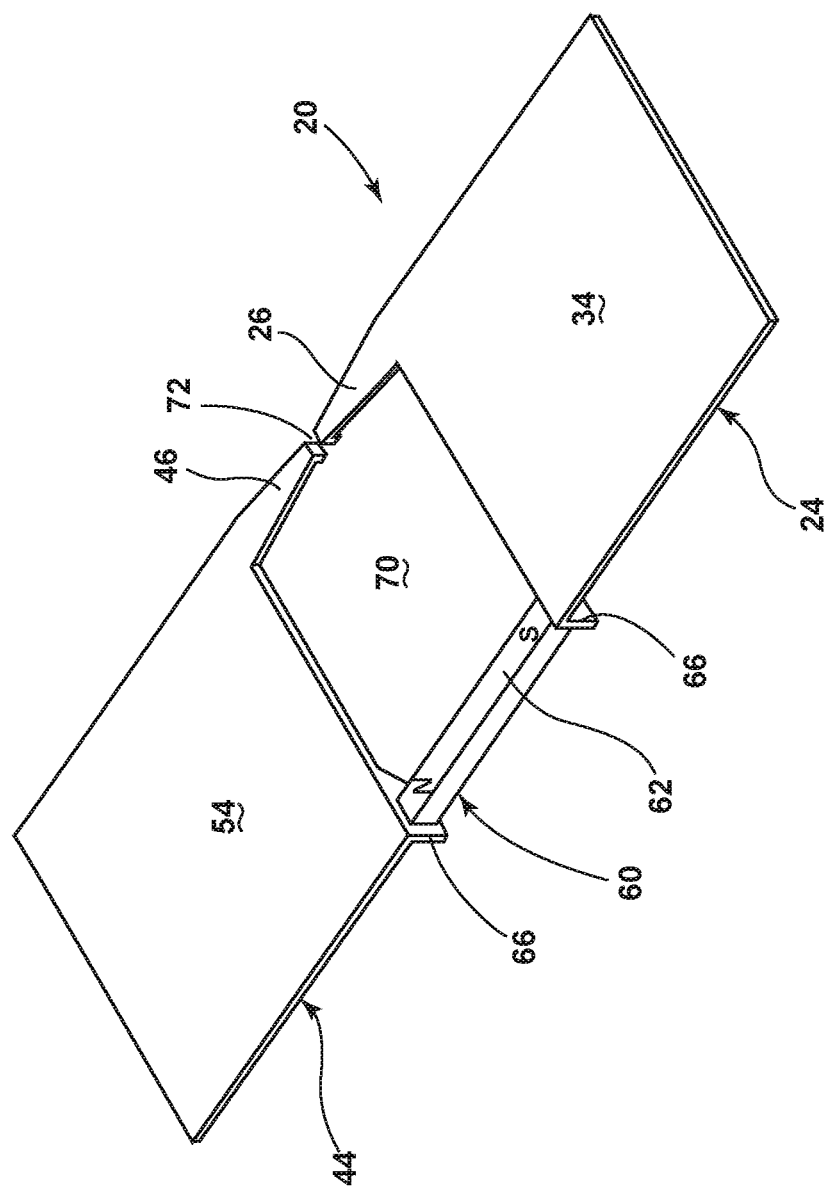
FIG. 8 is a perspective view of another embodiment of the magnetic proximity sensor.

FIG. 8 shows another embodiment of the long range magnetic proximity sensor 20. In this embodiment, the supports 66 of the magnetic assembly 60 are bent or shaped portions of the wings 24, 44 that receive the permanent magnet 62 therebetween. A narrow gap area 72 is provided between the protrusions 26, 46 to receive the Hall effect sensor 76.

The FIG. 8 embodiment operates in a similar manner to the embodiment of FIGS. 1-6 and has a similar shape and size, except for the protrusions 26, 46, which are tapered. Further, the gap 70 shown in FIG. 8 is proportionally larger than the gap 70 shown in FIG. 1.

Figure 9A:
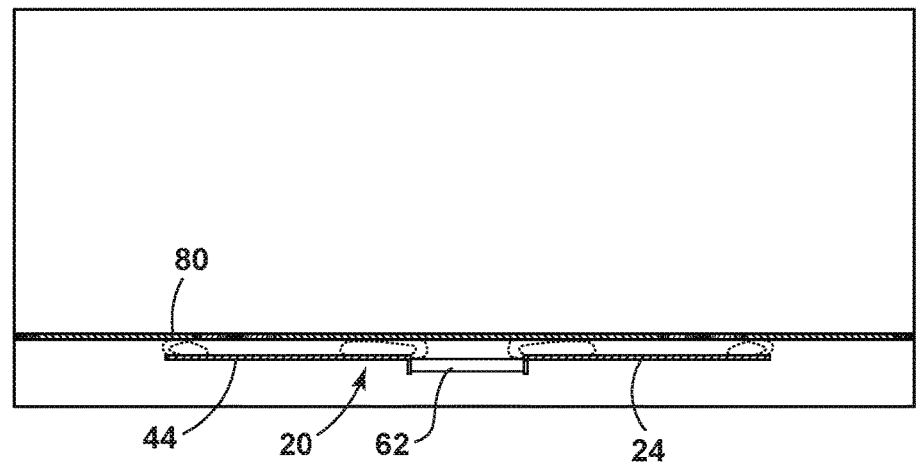
FIG. 9A is a top view of the magnetic proximity sensor of FIG. 8 and a close target that illustrates magnetic flux therebetween.

FIGS. 9A and 9B show magnetic flux for the embodiment of FIG. 8 when the target 80 is adjacent or close to the magnetic proximity sensor 20. As shown in FIG. 9A, there is strong magnetic flux transfer between the wings 24, 44 of the magnetic proximity sensor 20 and the target 80. Thus, a magnetic flux path is formed via the target 80 and thus significantly less magnetic flux passes across the narrow gap area 72 of the gap 70. The darkest areas in FIG. 9B show the strongest magnetic flux. The areas near the ends of the permanent magnet 62 each maintain a strong magnetic flux. The flux on the wing 24 near one end of the permanent magnet 62 moves mainly to the target 80 not shown in FIG. 9B and returns to the second wing 44 near the other end of the permanent magnet 62. Thus, the magnetic flux is strong in the magnetic proximity sensor 20 near the end of the permanent magnet 62 as the target 80 provides a magnetic circuit path, while the magnetic flux is significantly less at the protrusions 26, 46 of the wings 24, 44.

Figure 10A:
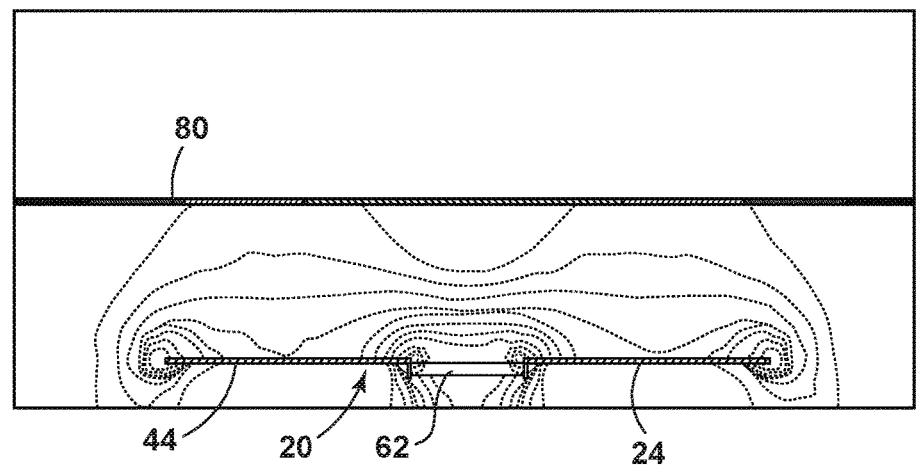
FIG. 10A is a top view of the magnetic proximity sensor of FIG. 8 and an intermediate target that illustrates the magnetic flux therebetween.
Figure 10B:
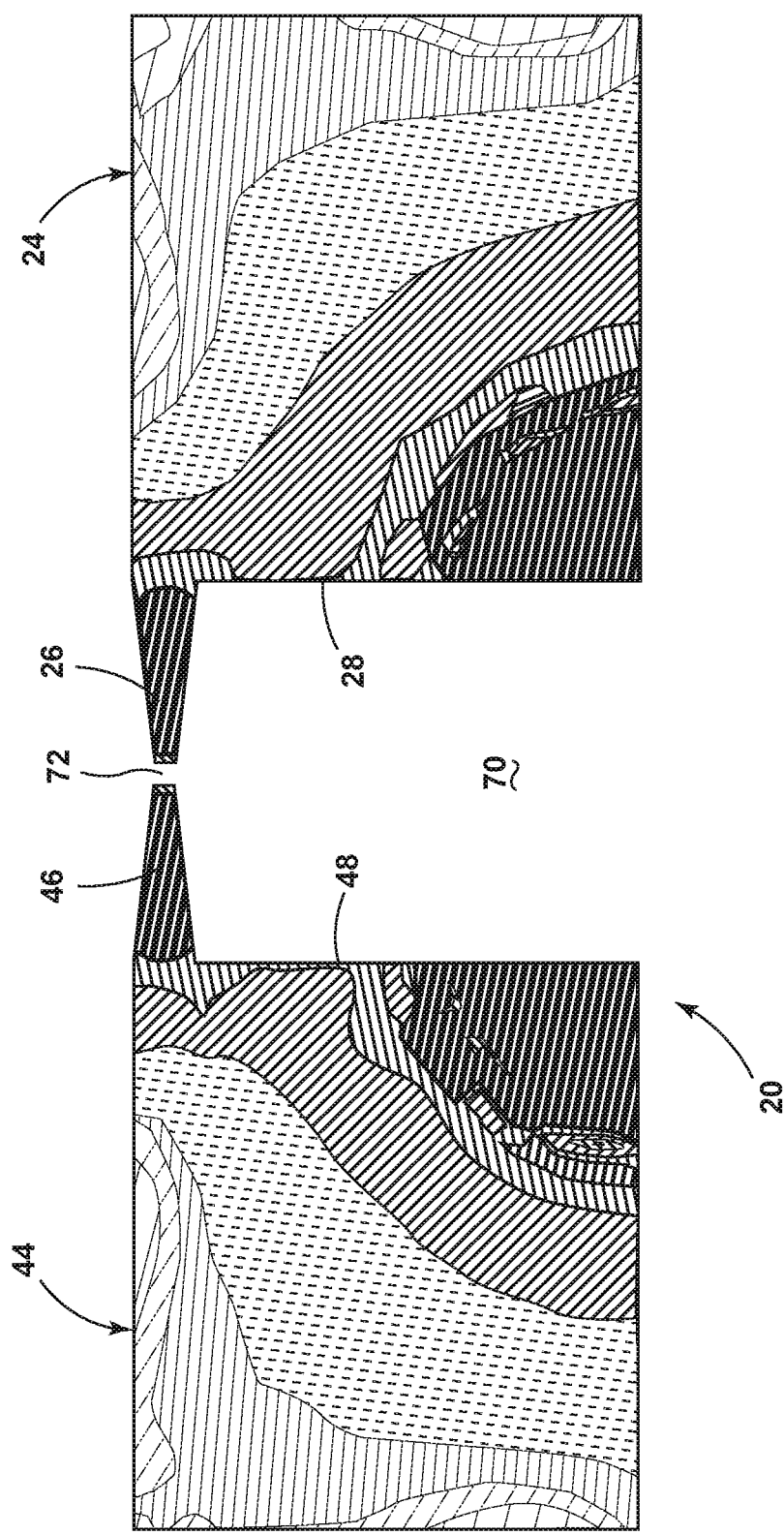
FIG. 10B is a front view of the magnetic proximity sensor intermediate the target and illustrating the magnetic flux of the wings.

FIGS. 10A and 10B show the magnetic flux after the target 80 moves an intermediate distance away from the magnetic proximity sensor 20. As shown in FIG. 10A, some of the magnetic flux travels to the target 80 from the magnetic proximity sensor 20. In this instance as compared to FIGS. 9A and 9B, more of the magnetic flux simply travels through the wing 44 and the protrusion 46 thereof, across the narrow gap area 72 and through protrusion 26 and the wing 24 to the S pole of the permanent magnet 62 as shown in FIG. 10B and FIG. 8. Thus, the magnetic flux is stronger at the protrusions 26, 46 than when the target 80 is a large distance from the magnetic proximity sensor 20.

Figure 11A:
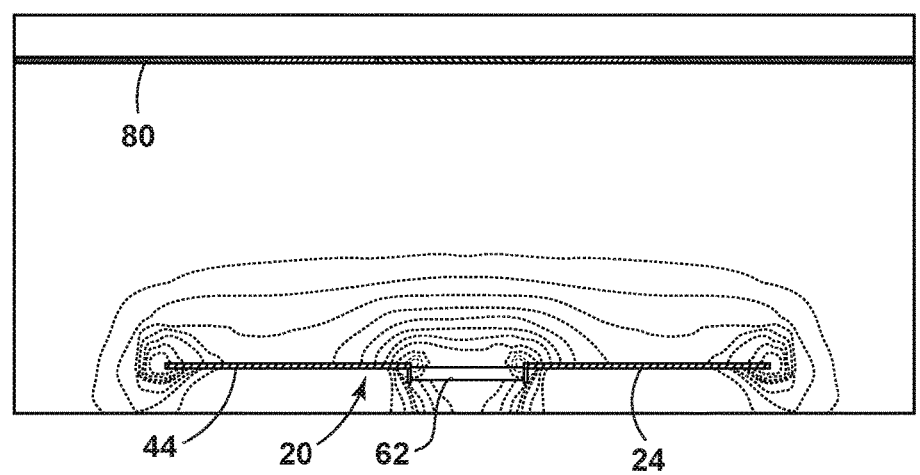
FIG. 11A is a top view of the magnetic proximity sensor of FIG. 8 and a far target that illustrates magnetic flux not acting therebetween.
Figure 11B:
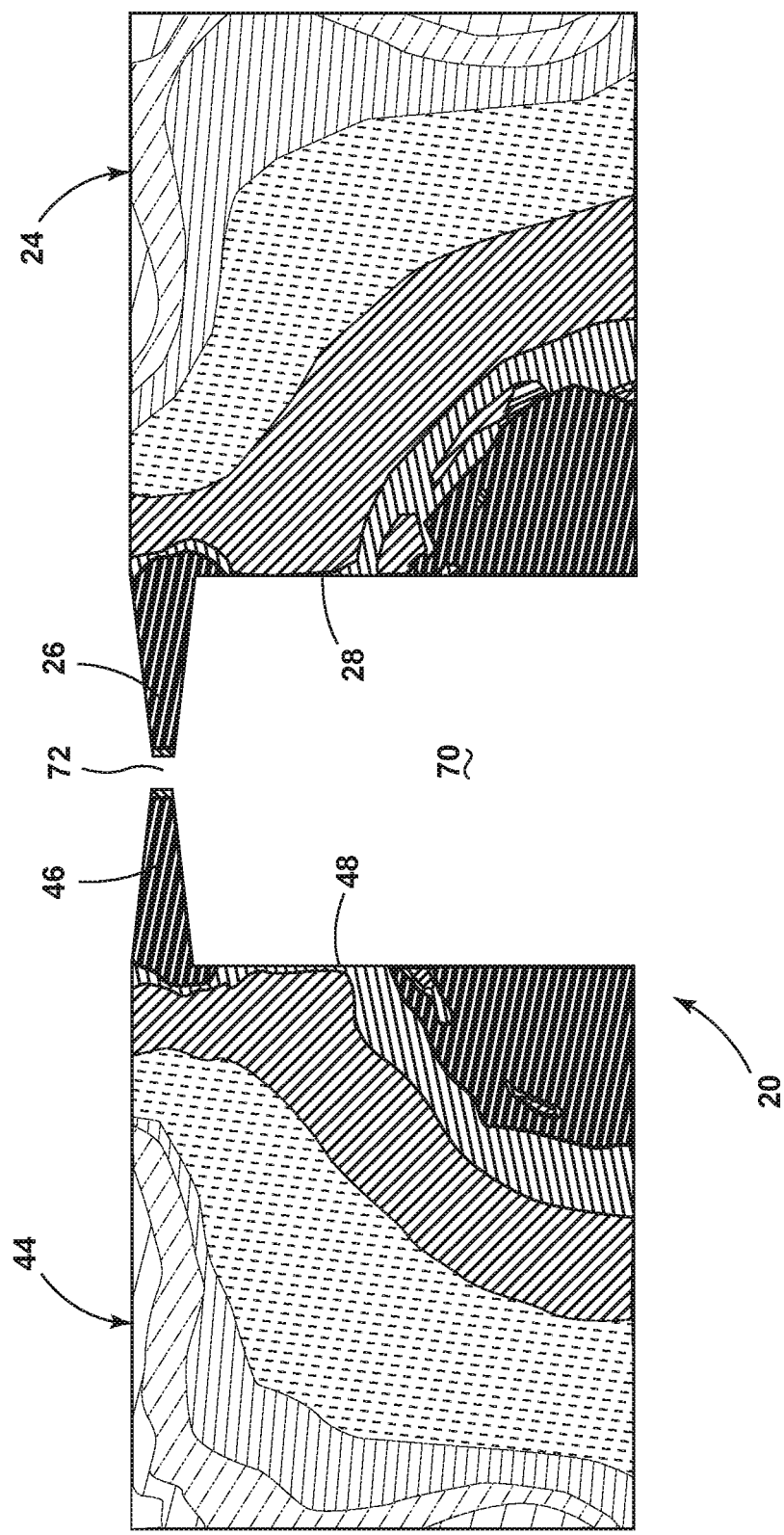
FIG. 11B is a front view of the magnetic proximity sensor far from the target and illustrating magnetic flux of the wings.

FIGS. 11A and 11B show the magnetic flux after the target 80 moves a large distance away from the magnetic proximity sensor 20. As shown in FIG. 11A, essentially none of the magnetic flux travels to the target 80 from the magnetic proximity sensor 20 due to the distance therebetween. In this instance, essentially all of the magnetic flux from the N pole of the permanent magnet 62 travels through the wing 44 and the protrusion 46 thereof, across the narrow gap area 72 and through protrusion 26 and the wing 24 to the S pole of the permanent magnet 62 as shown in FIG. 11B. Thus, the magnetic flux is strongest at the protrusions 26, 46 than when the target 80 is farthest from the magnetic proximity sensor 20.

Figure 12:
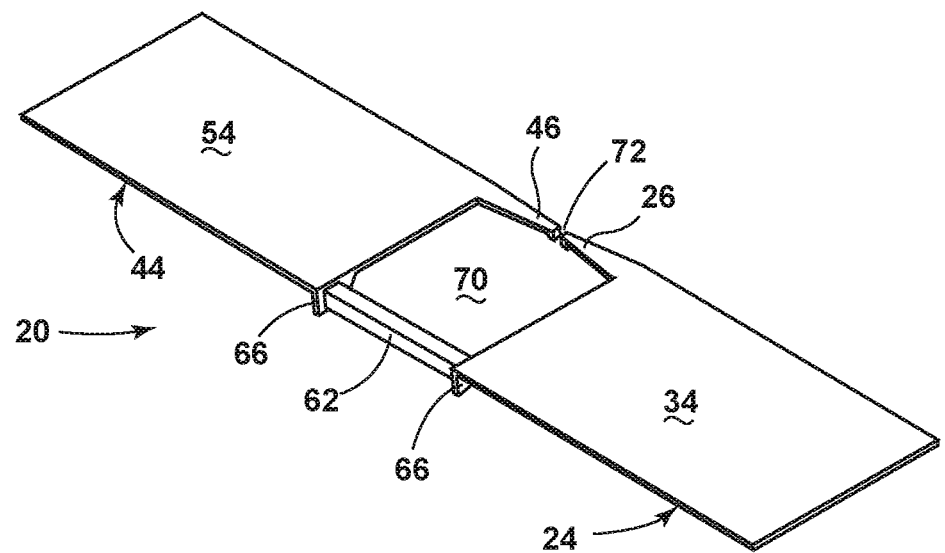
FIG. 12 is a perspective view of another embodiment of the magnetic proximity sensor.
Figure 13:
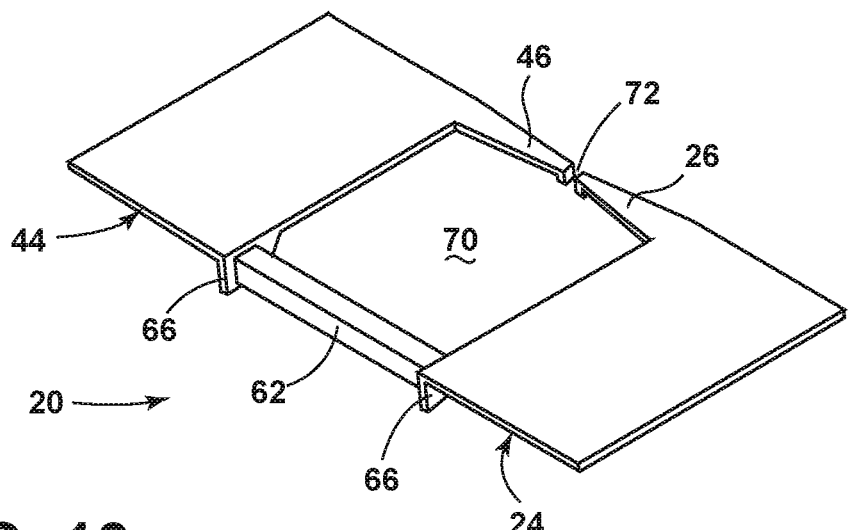
FIG. 13 is a perspective view of another embodiment of the magnetic proximity sensor.
Figure 14:
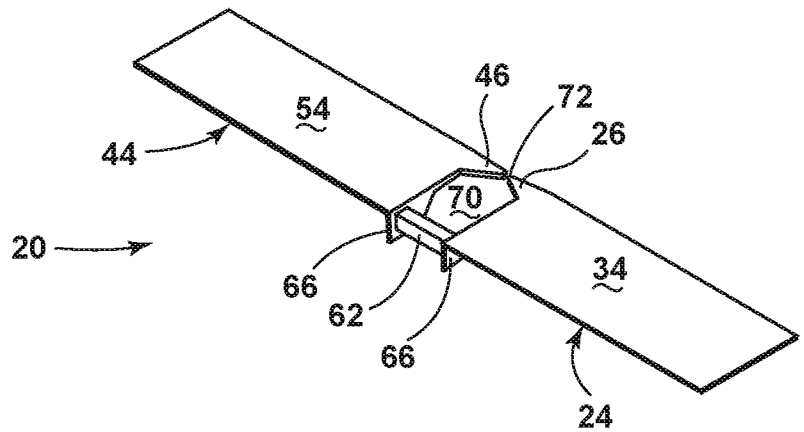
FIG. 14 is a perspective view of another embodiment of the magnetic proximity sensor.
Figure 15:
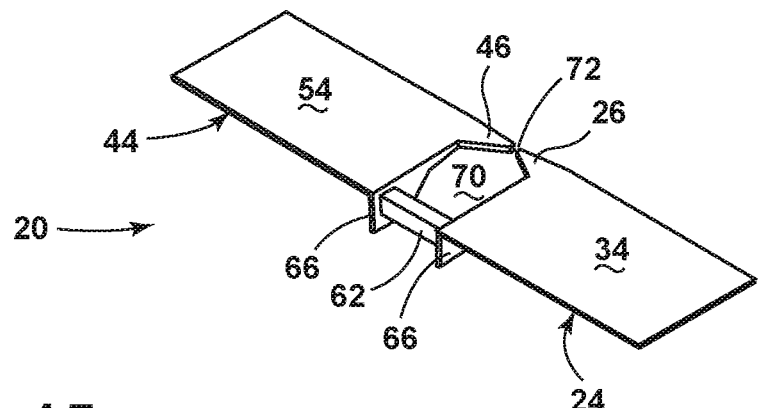
FIG. 15 is a perspective view of another embodiment of the magnetic proximity sensor.
Figure 16:
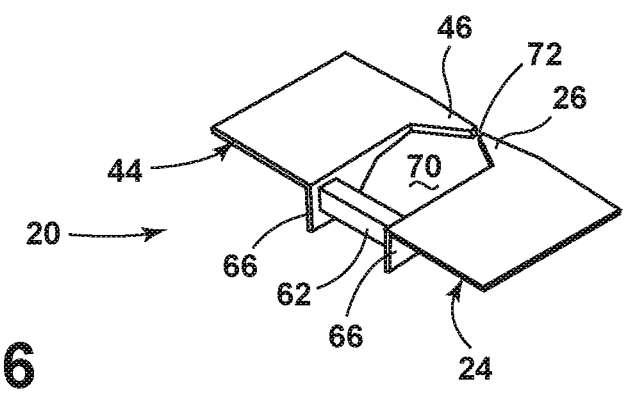
FIG. 16 is a perspective view of another embodiment of the magnetic proximity sensor.

FIG. 12 shows another embodiment of the magnetic proximity sensor 20 wherein the wings 24, 44 are thin planar elements, such as metallic sheets and the length of the elongate magnetic proximity sensor 20 is at least four times the height thereof. FIG. 13 shows another embodiment of the magnetic proximity sensor 20 wherein the wings are thin planar members and the length of the elongate magnetic proximity sensor is about two times the height thereof. Returning to the embodiment of FIG. 8, the magnetic proximity sensor 20 has a length that is about three times the height thereof. FIG. 14 shows another embodiment wherein the length of the magnetic proximity sensor 20 is about 6 times the height thereof. Likewise, the length of the magnetic proximity sensor 20 shown in the embodiment of FIG. 15 is about four times the height thereof. Finally, the embodiment of FIG. 16 shows a magnetic proximity sensor 20 wherein the length thereof is about two times the height thereof. In some embodiments, the magnetic proximity sensor 20 has a height that is between about 25% and about 50% of the length of the magnetic proximity sensor. However, other height- to length aspect ratios are contemplated.

Figure 17:
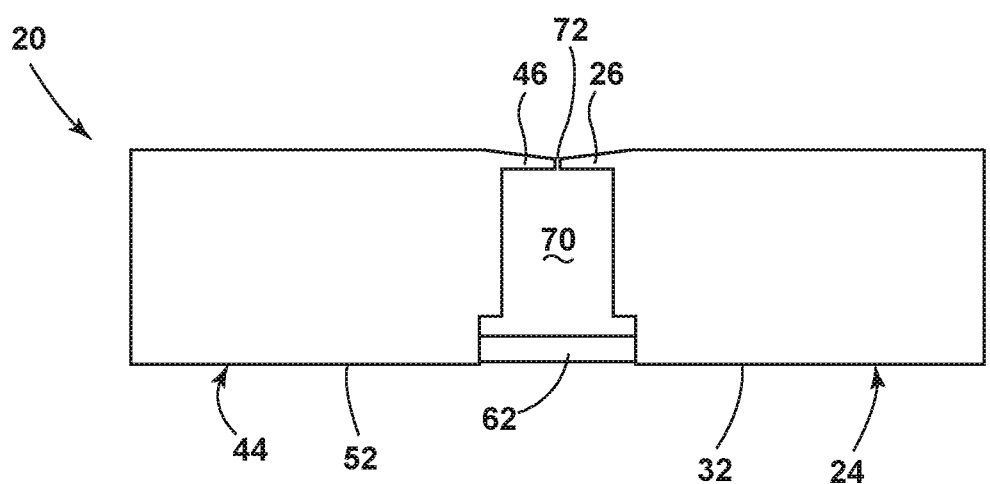
FIG. 17 is a front view of another embodiment of the magnetic proximity sensor.
Figure 18:
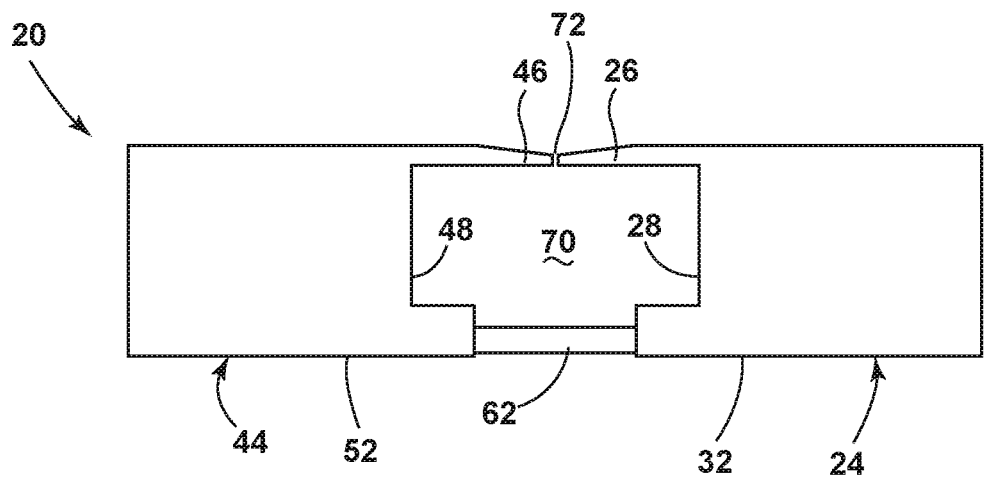
FIG. 18 is a front view of another embodiment of the magnetic proximity sensor.

The embodiments of FIGS. 17 and 18 illustrate variations in the size of the gap 70 of the magnetic proximity sensor 20. FIG. 17 shows the gap 70 of the magnetic proximity sensor 20 having a relatively small size in comparison to the wings 24, 44, and a widened area adjacent the permanent magnetic 66. FIG. 18 shows an embodiment with an enlarged gap 70. The gap 70 can be sized for various purposes and reasons. The narrow gap area 72 remains small to provide a magnetic circuit path for the magnetic proximity sensor 20.

Figure 19:
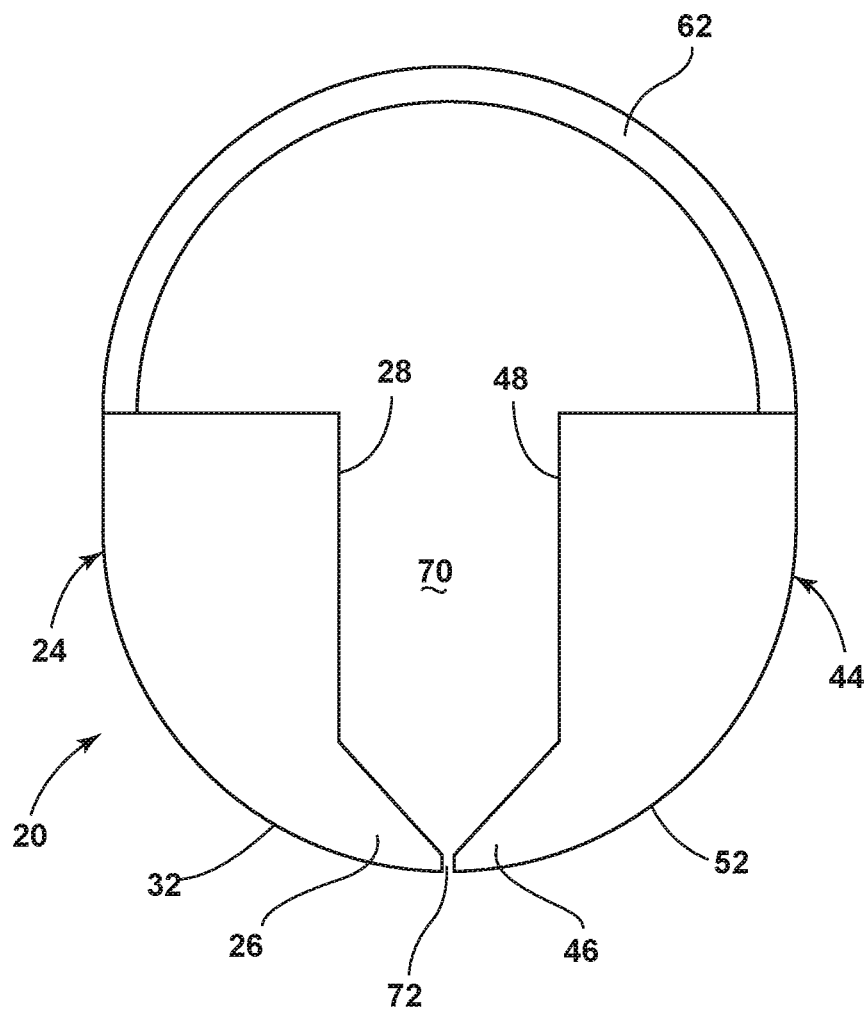
FIG. 19 is a front view of another embodiment of the magnetic proximity sensor that includes a curved permanent magnet.

FIG. 19 shows another embodiment of the magnetic proximity sensor 20 wherein the permanent magnet 62 has a curved shape and extends from a top inner corner of a wing 24 to a top inner corner of a wing 44. The wings 24, 44 having facing inner edges 28, 48 across a gap 70. Further, respective protrusions 26, 46 form a narrow gap area 72. The lower edges 32, 52 of the respective wings 24, 44 have a curved shape. In operation, the magnetic proximity sensor 20 operates in a similar manner to the previously disclosed embodiments. The target 80 used therewith, preferably is sized so that a portion thereof moves toward the entirety of the curved permanent magnet 62 of FIG. 19.

Figure 20:
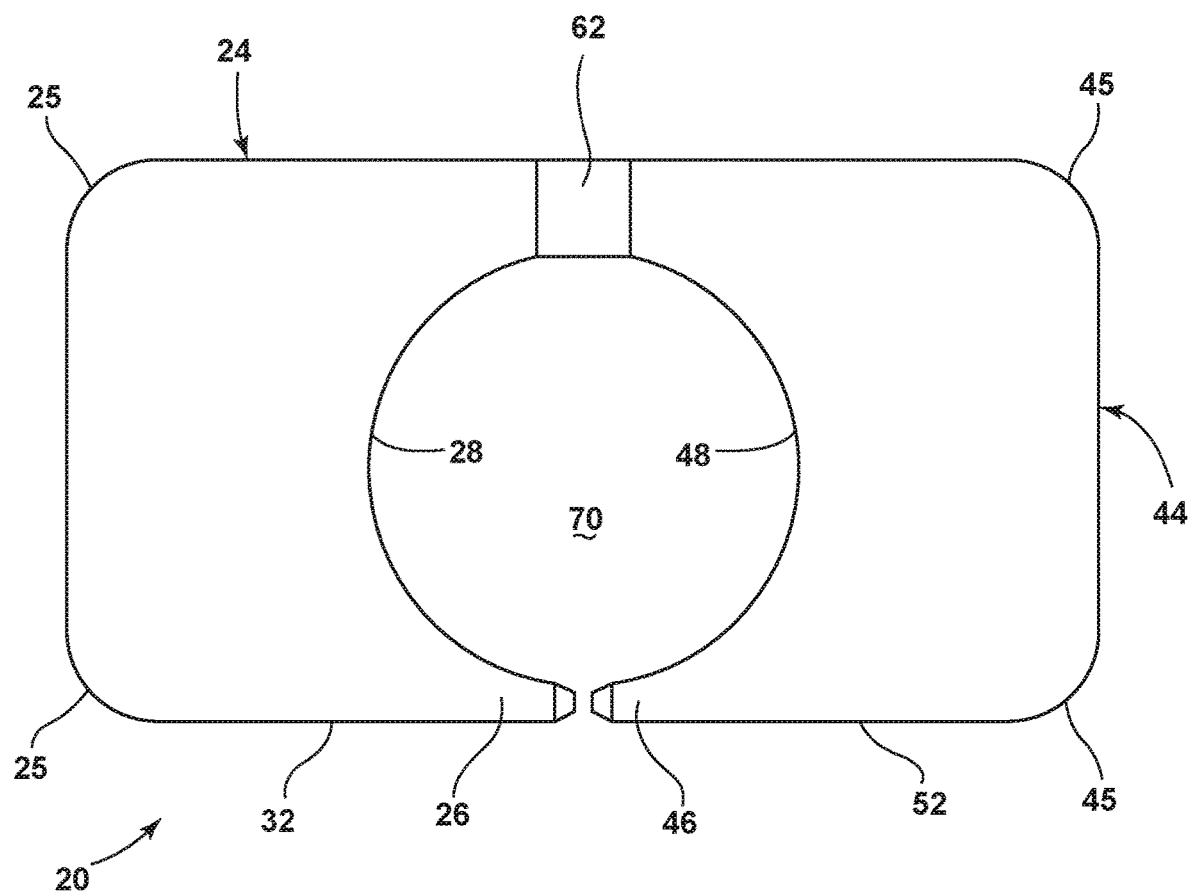
FIG. 20 is a front view of another embodiment of the magnetic proximity sensor.

FIG. 20 shows another embodiment of the magnetic proximity sensor 20, wherein the respective wings 24, 44 have rounded corners 25, 45. The facing inner edges 28, 48 have a curved shape. Thus, the gap 70 has a generally elliptical shape. The protrusions 26, 46 are tapered at the narrow gap area 72 of the magnetic proximity sensor 20.

Figure 21:
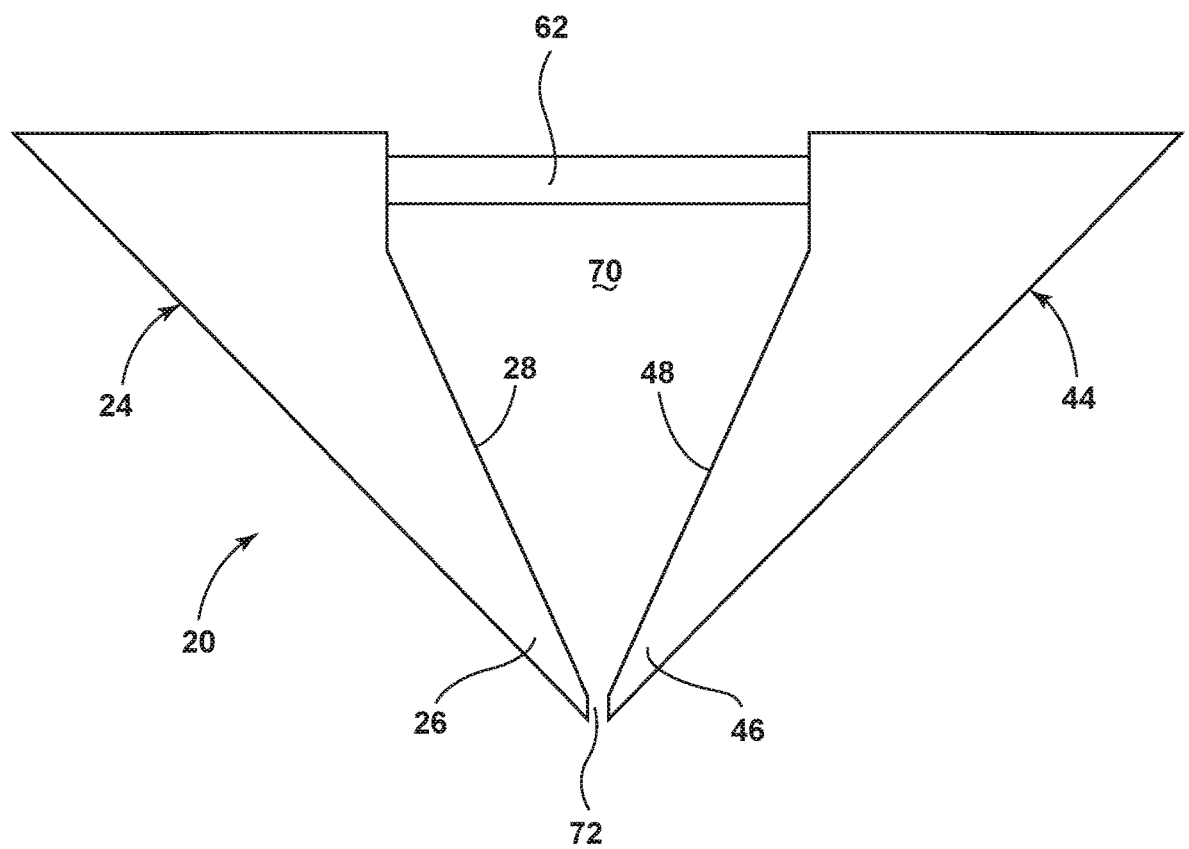
FIG. 21 is a front view of another embodiment of the magnetic proximity sensor.

FIG. 21 shows another embodiment of the magnetic proximity sensor 20, wherein the wings 24, 44 have generally triangular shapes. Thus, the shaped protrusions 26, 46 extend outwardly from near respective ends of the permanent magnet 62 a large distance and end at a narrow gap area 72. In this embodiment, the inner edges 28, 48 face each other at an angle instead of parallel to each other. Thus, at least a portion of the gap 70 between the wings 24, 44 has a generally triangular shape. Therefore, some embodiments of the invention have wings 24, 44 with different non-rectangular shapes.

Figure 22:
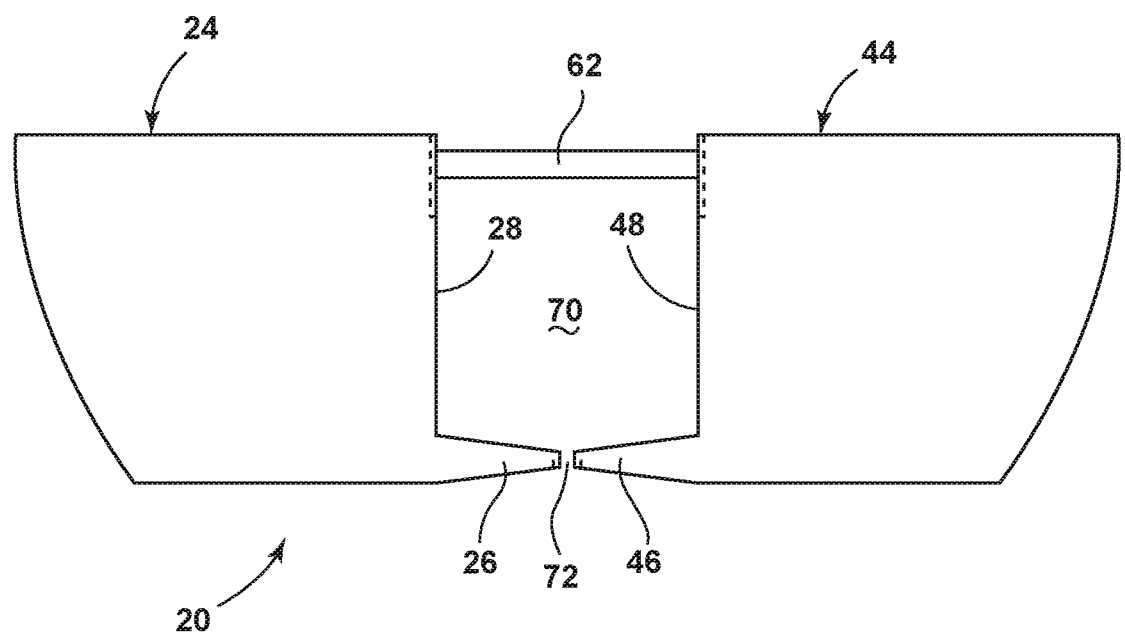
FIG. 22 is a front view of another embodiment of the magnetic proximity sensor.

FIG. 22 is another embodiment of the magnetic proximity sensor 20, wherein the wings 24, 44 have curved outer edges rather than generally flat edges. Thus, the length of the top of the magnetic proximity sensor 20 is greater than the length along the bottom of the magnetic proximity sensor. Otherwise, the protrusions 26, 46 and inner edges 28, 48 of the respective wings 24, 44 are similar to some of the earlier described embodiments of the magnetic proximity sensor 20. Thus, in some embodiments the edges of the wings are not necessarily parallel and are not necessarily substantially linear, but various shapes are possible to meet packaging limitations.

Figure 23:
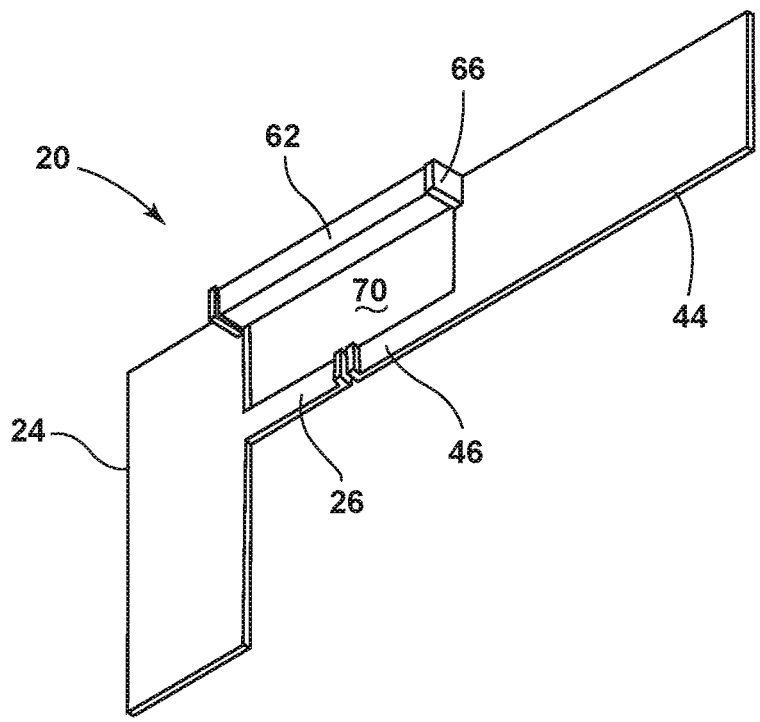
FIG. 23 is a perspective view of another embodiment of the magnetic proximity sensor.
Figure 24:
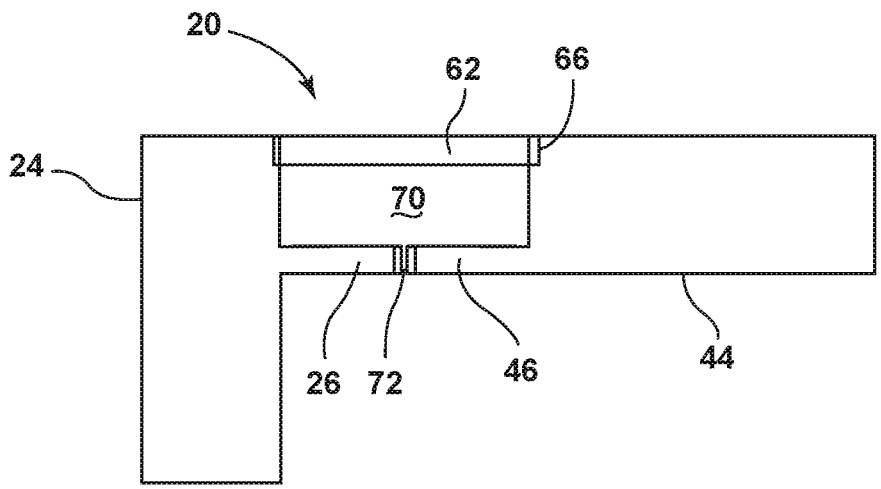
FIG. 24 is a front view of the magnetic proximity sensor of FIG. 23.

FIGS. 23 and 24 show another embodiment of the magnetic proximity sensor 20, wherein the wings 24, 44 have different shapes. The wing 24 is oriented downwardly and extends below the protrusion 26. Thus, the height of the wing 24 is greater than the height of the wing 44. The wings 24, 44 are non-symmetric and in a common plane for the magnetic proximity sensor 20 shown in FIGS. 23 and 24. The non-symmetric wings 24, 44 change the response of the magnetic circuit to some degree, but the magnetic proximity sensor 20 operates in a similar manner to the above disclosed embodiments. An approaching target significantly changes the flux through the magnetic proximity sensor 20, even when a target is a relatively large distance from the wings 24, 44.

Figure 25:
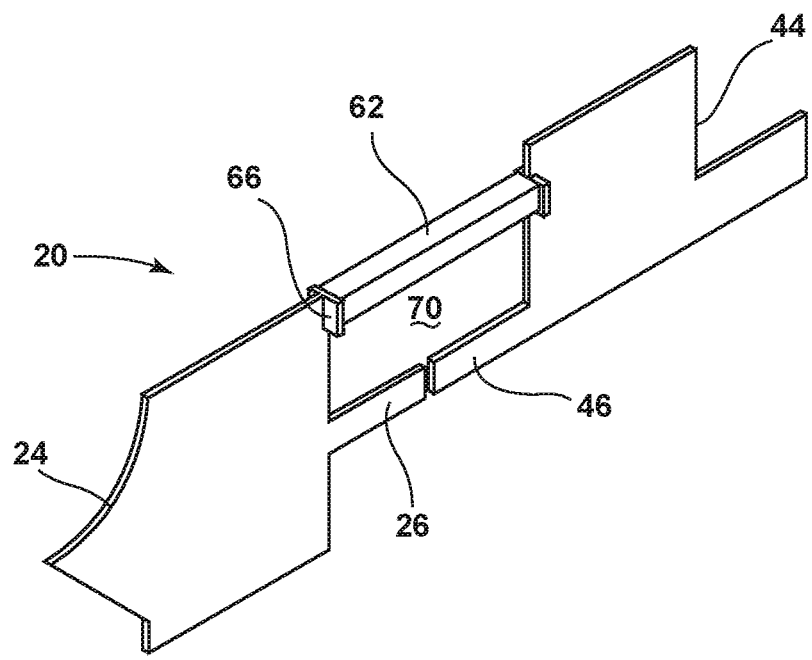
FIG. 25 is a perspective view of another embodiment of the magnetic proximity sensor.
Figure 26:
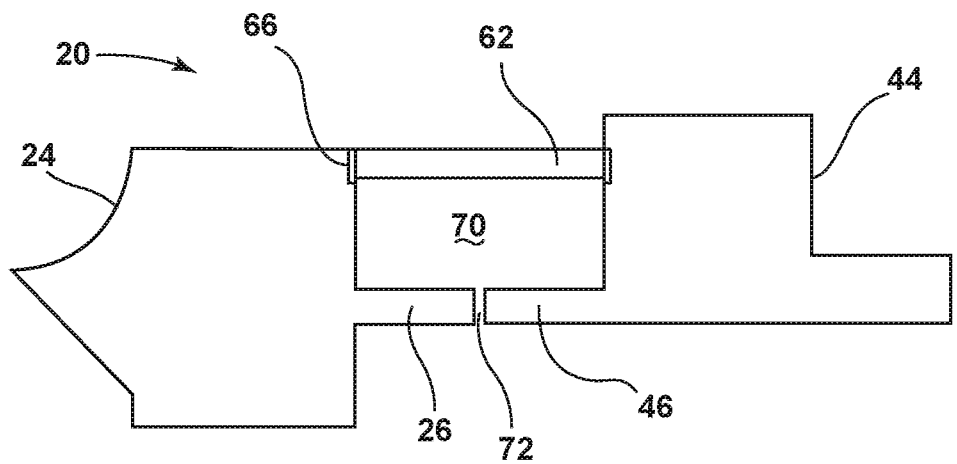
FIG. 26 is a front view of the magnetic proximity sensor of FIG. 25.

FIGS. 25 and 26 show another embodiment of the magnetic proximity sensor 20, wherein the wings 24, 44 have different shapes and thus are non-symmetric. The wing 24 is oriented both outwardly with a curved shape along an edge thereof and extends downwardly below the protrusion 26. Thus, the height of the wing 24 is greater than the height of the wing 44. The wings 24, 44 are also non-symmetric as shown in FIGS. 25 and 26 as the wing 24 has a rounded edge with an outwardly oriented pointed tip. The wing 44 has an enlarged opposing protrusion with respect to the protrusion 46. The non-symmetric wings 24, 44 shown in FIGS. 25 and 26 change the response of the magnetic circuit to some degree, but the magnetic proximity sensor 20 operates in a similar manner to the above disclosed embodiments. An approaching target 80 significantly changes the flux through the magnetic proximity sensor 20, even when the target is a relatively large distance from the wings 24, 44.

In the above embodiments of the magnetic proximity sensor 20, the wings 24, 44 and the respective protrusions 26, 46 typically have a generally flat planar shape and the wings are in a common plane. In additional embodiments, the wings 24, 44 and the target 80 have a matching concave shape. In another embodiment, the wings 24, 44 and the target 80 have a matching generally convex shape. In yet another embodiment, outer edges of the wings 24, 44 are folded or bent inwardly away from the target or outwardly toward the target. In this instance, the target 80 is bent at a corresponding location in the same direction to maintain or improve the magnetic flux flow therebetween. In yet another embodiment, a pattern of undulations in the thickness of the wings 24, 44 of the magnetic proximity sensor 20 are provided. Similar undulations in the thickness of the target 80 are provided in another embodiment.

In one embodiment, the wings 24, 44 are formed from thin steel plates. The steel plates have a height of about 50 millimeters (mm) and a length of about 100 mm including the respective protrusions 26, 46. Thus, the magnetic proximity sensor 20 has a length of at least about 200 mm and a height of about 50 mm in this embodiment. The wings 24, 44 and the target 80 do not need to have a solid form. In another embodiment, the wings 24, 44 and/or the target 80 are formed as a mesh or a screen of a high permeability material that attracts magnetic flux. In one embodiment, the protrusions 26, 46 are monolithic with the respective wings 24, 44.

The wings 24, 44 and the target 80 include various sizes and shapes. Further, the protrusions 26, 46 include various shapes and locations. In general, the larger the area of the wings 24, 44 and the larger the area of the target 80 that face each other, the greater the magnetic coupling between them so that the magnetic proximity sensor 20 is more effective over larger ranges of distance. While most embodiments show the wings 24, 44 as mirror images of one another, in some embodiments, the wings 24, 44 have different sizes, different shapes, and/or different thicknesses. The target 80 typically will have a matching size and shape corresponding to the wings 24, 44. Further, in one embodiment, the target 80 is much larger than the magnetic proximity sensor 20. In other embodiments, the approaching target 80 has non-rectangular shapes and are not necessarily planar.

In the above embodiments, the magnetic assembly 60 includes a permanent magnet 62 as a source for the magnetic flux provided to the wings 24, 44. In another embodiment, the magnetic assembly 60 includes a magnetic flux generator as an alternative. In one embodiment, the magnetic flux generator generates an alternating electrical current through a coil to produce the magnetic flux for the wings 24, 44. When a coil and an alternating current are used, the magnetic flux is modulated and then a synchronous demodulation technique enables sensing of magnetic flux levels. This technique dramatically improves immunity to external noise sources, such as low frequency magnetic fields that affect detection of the magnetic flux provided by a permanent magnet. The magnetic proximity sensor 20 can be used to identify the position of the target 80, or to identify when the position of a target has changed over a fixed period of time.

While not discussed in detail herein, the narrow gap area 72 of the gap 70 between the wings 24, 44 concentrates and promotes passage of magnetic flux between the protrusions 26, 46 of the wings. The wings 24, 44 of the magnetic proximity sensor 20 have a relatively high permeability even when the wings are very thin, such as less than a millimeter, or provided as a mesh or screen.

Vehicle Seat Control

Vehicle seat control is one of many purposes for the magnetic proximity sensor 20. In one known embodiment of a two seat vehicle, the front seats are movable and reclinable various amounts, which in some instances causes impact against a bulkhead and thus damage or wear to a seat or a seatback. Some known embodiments rely on a contact sensor to determine a seat in contact with a bulkhead to stop movement of the seat. Repeated contact of the vehicle seat and a bulkhead wears upon the seat material and results in a blemish or other damage. The bulkhead may also be worn. Another known approach provides optical proximity sensors to determine the distance of a seat or seatback from a bulkhead. Optical proximity sensors require a lens or opening to project light. Thus, the appearance of the seat or bulkhead is compromised.

In one embodiment, the magnetic proximity sensor 20 is mounted within the bulkhead or covered by outer surface components or material. Thus, the magnetic proximity sensor 20 is not visible. Therefore, the appearance of a vehicle interior and vehicle components are not compromised.

Figure 27:
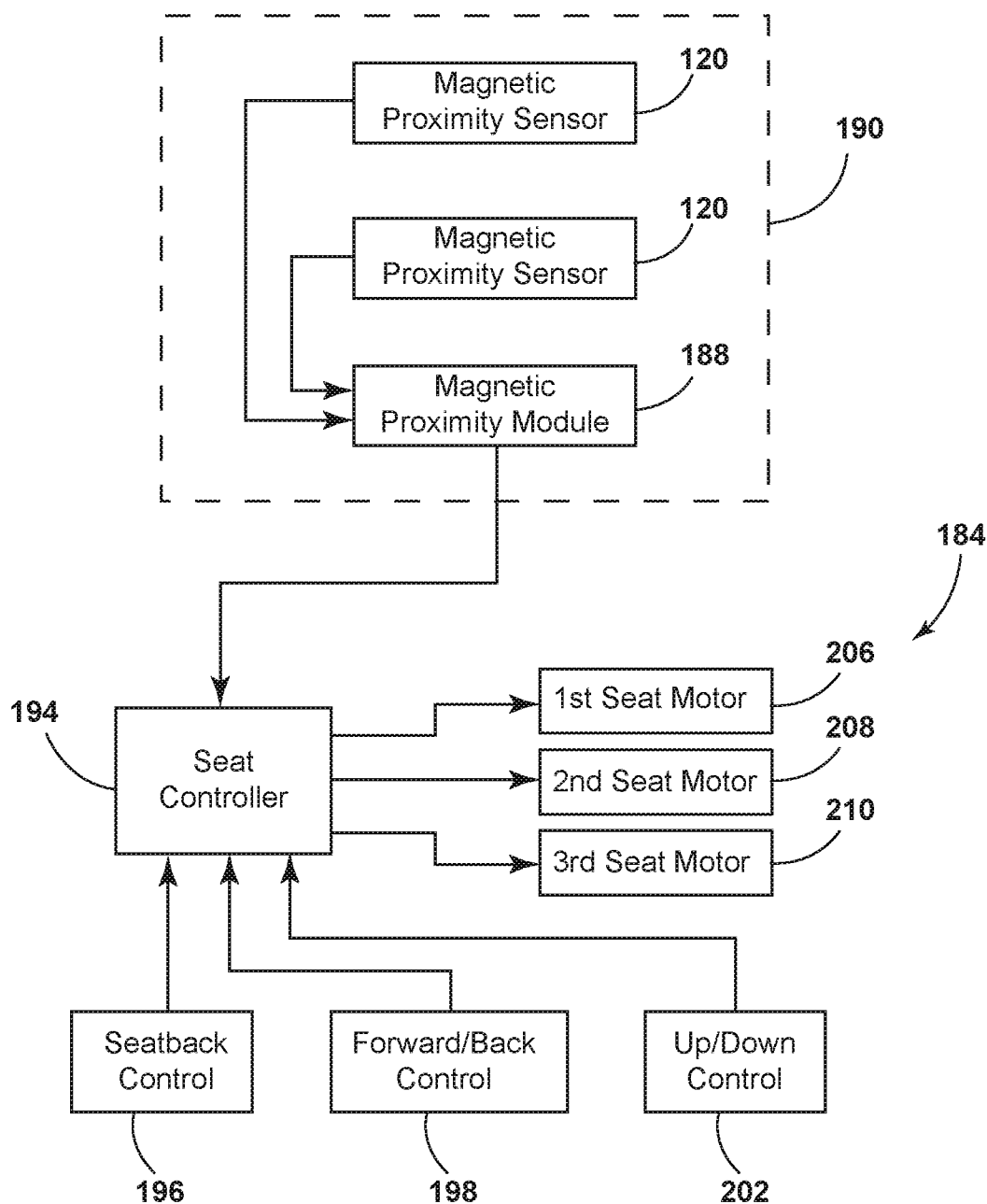
FIG. 27 is a block diagram of a vehicle seat control system including magnetic proximity sensors.

In the embodiment of a vehicle seat control system 184 shown in FIG. 27, a pair of magnetic proximity sensors 120 are connected to a magnetic proximity sensor module 188. The magnetic proximity sensors 120 and the magnetic proximity sensor module 188 are mounted in a bulkhead 190 in one embodiment. In another embodiment, the magnetic proximity sensors 120 and the magnetic proximity sensor module 188 are disposed within a vehicle seat and/or seatback.

The magnetic proximity sensor module 188 receives inputs from the magnetic proximity sensors 120 and determines when a target 80 is approaching. The magnetic proximity sensor module 188 provides an output, such as a one bit signal, to a seat controller 194 as shown in FIG. 27. The seat controller 194 includes a processor and memory for processing and controlling a vehicle seat and seatback. The seat controller 194 receives an input from a seatback control 196 for lowering or raising the seatback of the vehicle seat. The seat controller 194 also receives inputs from a vehicle seat forward/back control 198 and from a vehicle seat up/down control 202. The controls 196, 198, 202 are typically two direction switches for providing two different inputs. The seat controller 194 provides outputs to a first seat motor 206, a second seat motor 208 and a third seat motor 210. The seat motors 206, 208, 210 move the vehicle seat forwardly, rearwardly, up and down, along with moving or tilting the seatback.

In one embodiment, the target 80 that interacts with the vehicle seat control system 184 disposed in a bulkhead of a vehicle is a strip or sheet of material having high permeability material to attract magnetic flux. In one embodiment, a plurality of horizontally oriented targets 80 are provided on the rear of the vehicle seat and on the rear side of the seatback.

Vehicle Seat Control Operation

In operation, a vehicle passenger selects one or more of a seatback control 196, a vehicle seat forward/back control 198 and a vehicle seat up/down control 202 to move a vehicle seat or seatback to an appropriate desired position. In response to inputs from the controls 196, 198, 202, the seat controller 194 powers the seat motors 206, 208, 210 to move the vehicle seat to the desired position.

During movements of the vehicle seat, the magnetic proximity sensors 120 in the bulkhead 190 provide inputs to the magnetic proximity sensor module 188 regarding the magnetic flux being measured by respect Hall effect sensors 76. When the target 80 shown in FIG. 4 and FIG. 5 moves toward one of the magnetic proximity sensors 120, the voltage output of the corresponding Hall effect sensor 76 decreases, for instance as shown in the embodiment of the graph of FIG. 7. In one embodiment, the magnetic proximity sensor module 188 includes a processor that identifies the closeness of the approaching target 80 provided within or on a vehicle seatback or vehicle seat to a magnetic proximity sensor 120. The processor might identify the closeness of the approaching target 80 by identifying that the voltage output from the Hall effect sensor 76 has passed a fixed value or by identifying that the voltage output from the Hall effect sensor 76 shows a pattern over time indicative of an approaching target. The magnetic proximity sensor module 188 provides a one bit output to the seat controller 194. In response to the closeness identification, the seat controller 194 overrides the controls 196, 198, 202 to selectively deactivate the seat motors 206, 208, 210 and prevent the vehicle seat from contacting a bulkhead 190. Therefore, damage to the vehicle seat and/or the bulkhead 190 is avoided.

Thus, the invention provides, among other things, a magnetic proximity sensor that includes a pair of wings with a gap therebetween and a magnetic assembly that spans the gap and projects a magnetic flux toward a first wing so that magnetic flux passes via the first wing, a protrusion of the first wing and across a narrow gap area that includes a magnetic sensor element to the protrusion of the second wing and via the second wing to return to the magnetic assembly. Various features and advantages of the invention are set forth in the following claims.

What is claimed is:

1. A magnetic proximity sensor comprising:
   a first wing including a protrusion protruding outwardly from an edge thereof;
   a second wing including a protrusion protruding outwardly from an edge thereof, the edge of the second wing being spaced from and facing the edge of the first wing to form a gap therebetween, and the protrusions facing each other to provide a gap area between the protrusions, and the first wing and the second wing are aligned in a common plane and the second wing is a mirror image of the first wing;
   a magnetic assembly secured to the first wing adjacent the edge of the first wing and secured to the second wing adjacent the edge of the second wing, and spaced from the gap area, wherein the magnetic assembly extends across the gap and is aligned to project magnetic flux toward the first wing; and
   a magnetic sensor element disposed at the gap area between the first wing and the second wing,
   wherein the magnetic assembly projects the magnetic flux toward the first wing, and the magnetic flux passes via the first wing and the protrusion of the first wing across the gap area that includes the magnetic sensor element to the protrusion of the second wing and via the second wing to return to the magnetic assembly.

2. The magnetic proximity sensor according to claim 1, wherein the magnetic assembly includes a permanent magnet having a first end adjacent the first wing that projects the magnetic flux and a second end adjacent the second wing that receives the magnetic flux.

3. The magnetic proximity sensor according to claim 1, wherein the magnetic assembly includes a magnetic flux generator.

4. The magnetic proximity sensor according to claim 1, wherein the magnetic sensor element includes a Hall effect sensor.

5. The magnetic proximity sensor according to claim 1, wherein the first wing and the second wing are disposed essentially within a same plane and the first wing and the second wing each comprise a high permeability material.

6. A system including an approaching target and the magnetic proximity sensor according to claim 5, wherein the approaching target provides an alternative path for at least a portion of the magnetic flux sensed by the magnetic sensor element, and wherein reduced magnetic flux sensed by the magnetic sensor element indicates closeness of the approaching target.

7. The system according to claim 6, wherein the approaching target has a substantially rectangular flat sheet of a high permeability material that faces a planar face of the first wing and a planar face of the second wing of the magnetic proximity sensor, wherein a high permeability material attracts magnetic flux.

8. The magnetic proximity sensor according to claim 1, wherein the edge of the first wing is substantially parallel to the edge of the second wing except for the protrusions that face each other.

9. The magnetic proximity sensor according to claim 1, wherein each of the first wing and the second wing have a substantially rectangular shape and the protrusions oriented outwardly each include an outwardly oriented substantially linear edge portion, wherein each of the wings and the respective protrusions are substantially planar on opposing faces thereof.

10. The magnetic proximity sensor according to claim 9, wherein the magnetic proximity sensor has a height that is between about 25% and about 50% of the length of the magnetic proximity sensor.

11. The magnetic proximity sensor according to claim 9, wherein the protrusions of each of the wings are generally triangular shaped protrusions and are planar.

12. The magnetic proximity sensor according to claim 11, wherein the wings each include a thin high permeability metal sheet and the protrusion that is monolithic therewith.

13. The magnetic proximity sensor according to claim 1, wherein the gap area between the protrusions is disposed by a corner of the first wing and disposed by a corner of the second wing.

14. A magnetic proximity sensor comprising:
a first wing having a substantially planar face and a protrusion protruding from an edge;
a second wing having a substantially planar face and a protrusion protruding from an edge thereof, the edge of the second wing being spaced from and facing the edge of the first wing to form a gap therebetween, and the protrusions facing each other to provide a gap area between the first wing and the second wing, and the first wing and the second wing are aligned in a common plane and the second wing is a mirror image of the first wing;
a magnetic assembly secured to the first wing at the edge of the first wing and secured to the second wing at the edge of the second wing, and the magnetic assembly being spaced from the gap area, wherein the magnetic assembly extends substantially across the gap and is aligned to project magnetic flux toward the first wing; and
a magnetic sensor element disposed in the gap area between the first wing and the second wing,
wherein the magnetic assembly projects the magnetic flux toward the first wing, and at least a portion of the magnetic flux passes via the first wing and the protrusion of the first wing across the gap area to the protrusion of the second wing and via the second wing to the magnetic assembly, and
wherein the magnetic sensor element senses the magnetic flux to determine when an approaching target approaches the magnetic proximity sensor.

15. A vehicle seat control system including the magnetic proximity sensor according to claim 14, wherein the magnetic proximity sensor provides a signal to a seat controller.

16. The magnetic proximity sensor according to claim 14, wherein each of the first wing and the second wing have a substantially rectangular shape and the protrusions oriented outwardly each include an outwardly oriented substantially linear edge portion, wherein each of the wings and the respective protrusions are substantially planar on opposing faces thereof, wherein the magnetic proximity sensor has a height that is between about 25% and about 50% of the length of the magnetic proximity sensor.

17. The magnetic proximity sensor according to claim 16, wherein the protrusions of each of the wings are generally triangular shaped protrusions and are planar, wherein the wings each include a thin high permeability metal sheet and the protrusion that is monolithic therewith.

18. The magnetic proximity sensor according to claim 16, wherein the gap area between the protrusions is disposed by a corner of the first wing and disposed by a corner of the second wing.

19. The magnetic proximity sensor according to claim 14, wherein the edge of the first wing is substantially parallel to the edge of the second wing except for the protrusions that face each other.

20. The magnetic proximity sensor according to claim 19, wherein each of the first wing and the second wing have a substantially rectangular shape and the protrusions oriented outwardly each include an outwardly oriented substantially linear edge portion.

* * * * *